United States Patent
Bottomfield (10) Patent No.: US 6,506,312 B1
(45) Date of Patent: *Jan. 14, 2003

(54) VAPOR DEPOSITION CHAMBER COMPONENTS AND METHODS OF MAKING THE SAME

(76) Inventor: Roger L. Bottomfield, 1461 W. Tara Dr., Gilbert, AZ (US) 85233

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,550

(22) Filed: Apr. 26, 1999

Related U.S. Application Data (63) Continuation-in-part of application No. 08/783,880, filed on Jan. 16, 1997, now abandoned.

(51) Int. Cl.[7] .............................................. B44C 1/22
(52) U.S. Cl. ............................ 216/11; 216/49; 216/58; 216/83; 204/192.32; 204/298.11; 204/298.31; 156/345.1; 118/715
(58) Field of Search ............................. 216/11, 49, 52, 216/56, 58, 83; 204/192.32, 298.11, 298.31; 156/345.1; 118/715

(56) References Cited

U.S. PATENT DOCUMENTS

| | | | |
|---|---|---|---|
| 2,355,949 A | * 8/1944 | Boutwell | 154/2 |
| 4,508,612 A | 4/1985 | Blackwell et al. | 204/298 |
| 4,661,233 A | 4/1987 | Glasser | 204/298 |
| 4,725,334 A | * 2/1988 | Brimm | 216/34 |
| 4,774,122 A | * 9/1988 | Adler | 216/36 |
| 4,802,968 A | 2/1989 | Hendrix et al. | 204/298 |
| 4,851,101 A | 7/1989 | Hutchinson | 204/298 |
| 5,080,774 A | * 1/1992 | Heitzer | 204/298.11 |
| 5,135,629 A | * 8/1992 | Sawada et al. | 204/192.12 |
| 5,202,008 A | 4/1993 | Talieh et al. | 204/192 |
| 5,380,415 A | 1/1995 | Poorman et al. | 204/192 |
| 5,382,339 A | 1/1995 | Aranovich | 204/192 |
| 5,391,275 A | 2/1995 | Mintz | 204/192 |
| 5,441,615 A | 8/1995 | Mukai et al. | 204/192 |
| 5,460,708 A | 10/1995 | Takeuchi et al. | 204/298 |
| 5,474,649 A | * 12/1995 | Kava et al. | 156/643.1 |
| 5,482,612 A | * 1/1996 | Armstrong et al. | 204/298.1 |
| 5,517,758 A | * 5/1996 | Nakamura | 216/36 |
| 5,518,593 A | 5/1996 | Hosokawa et al. | 204/192 |

(List continued on next page.)

FOREIGN PATENT DOCUMENTS

| | | | |
|---|---|---|---|
| EP | 0882812 A1 | 12/1998 | |
| JP | 1-268884 A | * 10/1989 | 216/34 |
| JP | 08176816 A | 7/1996 | |
| JP | 08277460 A | 10/1996 | |
| JP | 08333678 | 12/1996 | |
| JP | 09-143716 A | * 6/1997 | |

OTHER PUBLICATIONS

Greschner, J. et al "Method of Improving the Adhesion of Copper on a Plastic Laminate" IBM Tech Discl Bull 26(2) 675–676, Jul. 1983.*

European Search Report issued in Application No. EP 98901825.4, Nov. 15, 2001.

*Primary Examiner*—Anita Alanko
(74) *Attorney, Agent, or Firm*—Gray Cary Ware & Freidenrich, LLP (57) ABSTRACT

The present invention provides a method of reducing or delaying the exfoliation of deposited films within a vapor deposition system. The method of preventing the delamination of thin films deposited of a vapor deposition chamber components includes the steps of depositing a series of thin films on a discontinuous surface. The internal stress of the deposited thin film laminates are relaxed by fragmenting the deposited thin film laminates into a plurality of discontinuous surfaces. Thus allowing the exfoliation process of the thin film laminates to be delayed.

5 Claims, 3 Drawing Sheets

U.S. PATENT DOCUMENTS

| | | | |
|---|---|---|---|
| 5,527,438 A | | 6/1996 | Tepman ..................... 204/192 |
| 5,614,071 A | * | 3/1997 | Mahvan et al. ........ 204/298.11 |
| 5,628,839 A | * | 5/1997 | Saso et al. .................. 148/252 |
| 5,637,199 A | * | 6/1997 | Lorentz et al. .......... 204/192.1 |
| 5,653,891 A | * | 8/1997 | Otsuki et al. ................. 216/11 |
| 5,755,887 A | * | 5/1998 | Sano et al. ................. 118/715 |
| 5,804,046 A | * | 9/1998 | Sawada et al. ........ 204/298.11 |
| 5,837,057 A | * | 11/1998 | Koyama et al. ...... 118/723 VE |
| 6,007,673 A | * | 12/1999 | Kugo et al. ................. 156/345 |
| 6,059,938 A | * | 5/2000 | Visser .................. 204/192.12 |
| 6,077,404 A | * | 6/2000 | Wang et al. ........... 204/192.15 |

* cited by examiner

VAPOR DEPOSITION CHAMBER COMPONENTS AND METHODS OF MAKING THE SAME

RELATED APPLICATIONS

This application claims priority to and repeats a substantial portion of prior application entitled "Vapor Deposition Components and Methods of making the same" filed on Jan. 16, 1997, which was accorded Ser. No. 08/783,880, now abandoned. Since this application names the inventor named in the prior application, the application constitutes a continuation-in-part of the prior application. Additionally, this application incorporates by reference the prior application filed on Jan. 16, 1997, which was accorded Ser. No. 08/783,880.

FIELD OF THE INVENTION

The present invention relates generally to components that are used in a vapor deposition chamber, and, more particularly, to shields and retainer rings with features that greatly reduce the amount of contaminants produced by delamination or exfoliation of sputtered material from such shields and retainer rings.

BACKGROUND OF THE INVENTION

The need to have a clean environment for manufacturing processes in many different industries is well known. The clean environment is especially important when the manufacturing process involves the application of thin film materials, which, in many instances, have thicknesses on the same order as microcontaminants. In these cases, microcontaminants affect the properties of the thin film materials. Therefore, the existence of microcontaminants is a significant problem in these processes.

Vapor deposition systems have a process chamber, in which thin films are deposited. Since thin film deposition is carried out repetitively in the process chamber, a laminated film is likely to be formed on the interior wall of the process chamber. When the total thickness of the laminated film stack deposited on the interior wall exceeds a certain level, it begins to exfoliate. Exfoliation is caused by different thermal expansion coefficients within the film stack and interior wall of the process chamber, or due to membrane stresses within the laminated film itself. Exfoliation generates particles which may be in turn incorporated into thin films deposited on to substrate resulting in defects such as pinholes or contaminants within the film. Therefore, the interior of the process chamber must be cleaned before the thin film exfoliation starts. In a chemical vapor deposition system, a chemical etch is often used between deposition cycles without actually removing the deposition system from operation. However, this etch does not always remove deposited films.

Physical vapor deposition involve depositing thin films on a substrate or wafer in an evacuated chamber. In this process, a target material is bombarded with gaseous ions. The gaseous ions dislodge atoms from the target material. The dislodged material either follows a ballistic trajectory or is focused in the direction of the substrate or wafer to improve the efficiency of the process. The sputtered material adheres to both the substrate and its surroundings. Target materials which are sputtered onto a substrate or wafer, collect also on the process chamber walls. Since most chamber walls are planar and continuous, stresses in the deposited thin films materials builds rapidly across the entire film until the stresses reach a critical point. Stress is then released within the film through buckling or exfoliation from the adhered to surface(s) of the process chamber. This causes small pieces (particulates) of sputtered material to be released into the vapor deposition chamber. These microcontaminants then reach the substrate and can significantly affect the properties of the thin film.

One solution is to facilitate the removal of deposited films which have been sputtered onto chamber walls. This is accomplished with the installation of a removable shadow shielding system. This system does not prevent the materials from being sputtered inside the chamber and does not prevent or reduce the stresses in the thin films deposited across the surface of the shadow shielding system. However, this removable shadow shielding system allows a user to remove the shields and quickly install clean ones. This reduces the overall time that the manufacturing process chamber is removed from operation and production while these films are removed.

The shadow shield is placed around the substrate or wafer in order to reduce the amount of sputtered material from reaching the vapor deposition chamber walls. Furthermore, a retaining ring is sometimes used to hold the wafer in place within the vapor deposition chamber. These components only reduce the microcontamination problem since the sputtered metal collected on the shield or retaining ring will eventually buckle or delaminate, contaminating the chamber and/or the wafer.

Many attempts have been made to create vapor deposition chamber components which reduce or eliminate exfoliation or buckling of deposited thin films. One method of reducing microcontamination is to create a random and micro-rough surface on the vapor deposition component(s). One example of such a component is a sputtering shield that is disclosed in U.S. Pat. No. 5,202,008, by Talieh et al. ("Talieh") wherein the sputtering shield is bead blasted and sputter etched clean to create a micro-rough surface for adhesion of sputtered material. The micro-rough surface may allow an increase in nucleation sites which should minimize the formation of interface voids, thereby reducing the amount of microcontaminants. Another example of a sputtering shield is disclosed in U.S. Pat. No. 5,391,275, by Mintz ("Mintz"), in which the sputtering shield and clamping ring are bead blasted, ultrasonically cleaned, and, either: 1) sputter etched cleaned, 2) plasma reactively cleaned, or 3) plasma nonreactively cleaned. These processes create the same rough surface as taught in the Talieh patent. It is even known that attaching a layer of microcrystalline alumina (Aluminum Oxide, A1203) on the surface of a sputtering shield helps reduce the microcontaminants. The micro-roughening of the surfaces of these components reduces the amount of microcontamination within a vapor deposition chamber, but there is still a need for further reduction of these microcontamination amounts.

Another method for reducing microcontaminants is to paste or coat the sputtered material onto the surface of the vapor deposition components. An example of such a method is disclosed in U.S. Pat. No. 5,382,339 by Aranovich ("Aranovich"). Aranovich teaches the pasting of previously deposited material onto the surface by sputtering a material such as aluminum or titanium on top of the previously deposited material. This pasting holds the potential exfoliants to the surface and prevents buckling. However, this pasting, which is equivalent to lacquering, merely adds another layer of material on top of the potential exfoliant which could also buckle as well. Furthermore, this method of pasting or coating increases the complexity of the process, and, while helpful, it is not a final solution to the problem. These methods and devices serve to reduce the problem of stray particulates in the clean environment necessary for thin film deposition, but there remains a further need for vapor deposition chamber components which reduce, or even eliminate, the problem of exfoliation contamination.

SUMMARY OF THE INVENTION

Therefore, there is a need for improved vapor deposition chamber components which inhibit or prevent the formation of microcontaminants in a vapor deposition chamber.

A need exists for a method of making a vapor deposition chamber component surfaces which inhibit or prevent the formation of microcontaminants in a vapor deposition chamber that includes the step of selectively etching portions of the surface thereby creating a discontinuous surface to relax stress within deposited thin films.

Moreover, a need exists for a vapor deposition chamber component, such as a shield or retaining ring, that has such a discontinuous surface. The discontinuous surface is defined as a surface with features such as a plurality of projections, cavities, channels or grooves, partitions, or combinations thereof or equivalents.

Yet another need exists for a vapor deposition chamber component with a discontinuous surface that accumulates thin films not deposited on the substrate onto a vapor deposition chamber component surface and secures the thin films to the surface while inhibiting their exfoliation. Therefore reducing the amount of microcontaminants inside the vapor deposition chamber.

Moreover, a need exists for a vapor deposition chamber components which have projections, cavities, channels or grooves, partitions, or combinations thereof or equivalents thereof with a variety of acute angles in order to prevent microcontamination of the clean environment of the vapor deposition chamber.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIGS. 9–13 depict an embodiment of the etching method according to the present invention wherein these embodiments utilize photolithography to create a textured surface on vapor deposition chamber components;

FIG. 9 shows a surface on a vapor deposition chamber component;

DETAILED DESCRIPTION OF THE INVENTION

Preferred embodiments of the present invention are illustrated in the FIGURES, like numerals being used to refer to like and corresponding parts of the various drawings.

The present invention is intended to prevent or delay the delamination or exfoliation of a series of deposited thin films. This delamination or exfoliation generates microcontaminants which can result in the contamination of a vacuum process chamber.

The present invention provides a system having and a method for creating a textured or discontinuous surface within a vacuum process system that prevents or delays particle formation inside the system. Furthermore, the present invention will prevent or delay particles generated from the exfoliation of deposited thin films from the process chamber walls. The surface provided by the present invention has a macroscopically textured or discontinuous surface made of a number of raised horizontal surfaces with undercut vertical sidewalls. A film that is deposited on such a surface is done in a discontinuous manner, thereby relaxing the membrane stress and delaying the start of film exfoliation. Typically, there are less than fifty raised horizontal surfaces per inch on the surface of the deposition chamber component shielding. However, the present invention need not be limited to less than fifty raised horizontal surfaces per inch.

In the present invention, the expression that a deposited film is discontinuous may be defined such that the film is interrupted. Discontinuous includes not only gaps within the film but also a film which substantially covers the entire surface while being redirected by discontinuities on the surface on which the film is deposited. The term "continuous" means that a deposited film is substantially formed all over a surface without any discontinuity within the film or the surface to be covered.

One embodiment of the present invention provides a system or method of reducing particle exfoliation within a vapor deposition processing system. These particles would cause the deposited film quality to decrease. In a semiconductor manufacturing process, this would directly correlate to reduced product yields. Furthermore, the delay to the start of the exfoliation of the deposited films within the vacuum process chamber allows the frequency with which the process chamber needs to be opened to be greatly reduced. In a semiconductor manufacturing process, this would be directly reflected in increased productivity. However, the present invention need not be limited to deposition processes.

The present invention may be applied to any physical vapor deposition of thin films is accomplished by sputtering a target material. In this phenomenon, accelerated high-energy particles are made to collide with a target material, atoms or molecules in the target exchange momentum with the high-energy particles causing their release into the process chamber or free space. A physical vapor deposition system utilizes this phenomenon to create a film by allowing the dislodged atoms to collect as a thin film on a substrate. When this film is formed, sputtered material is deposited, not only on the substrate, but also on the surrounding process chamber surfaces, substantially in the same film thickness.

The vapor deposition system may also include an evaporative deposition system such as that where a metal or insulator is heated in a vacuum by resistive heating and the evaporating particles are released to the chamber or free space. The particles condense on a substrate to form a thin film. Vapor deposition may further include chemical vapor deposition system where a chemical process is employed to generate a plasma which produces a thin film on the substrate. Furthermore, the present invention may be applied.

Figure 1:
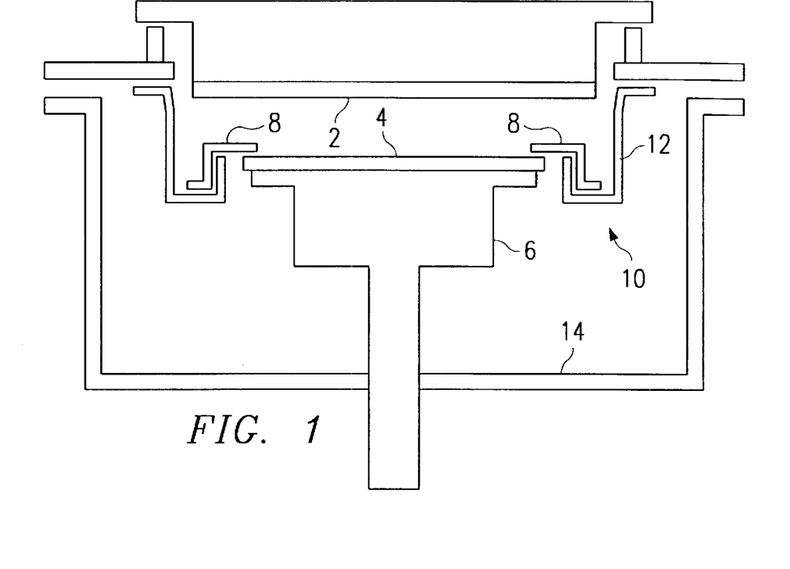
FIG. 1 shows a cross sectional side view of a vapor deposition chamber.

Physical vapor deposition is generally performed in an evacuated sputtering chamber. FIG. 1 illustrates a cross sectional side view of such a physical vapor deposition chamber. In such a system, a substrate 4 is subjected to bombardment by sputtered atoms from a sputtering source 2. The substrate 4, typically a wafer, is placed upon a pedestal 6 and held in place with a retaining ring 8. A sputtering shield 10 which protects the vapor deposition chamber walls 14 from excessive contamination by sputtered materials is located around the wafer 2.

However, the present invention may be utilized for carrying out its purposes within any suitable system or method for the deposition of thin films on surfaces, and the present invention is not in any way limited to use within the vapor deposition system or apparatus shown or described in the FIGUREs or specification.

This application may also be applied to a plasma etch reactor or like processes in which thin films are deposited within the reactor chamber as a by-product of the process.

FIG. 1 illustrates a typical cross-sectional view of a physical vapor deposition chamber. The chamber is evacuated and filled with an inert gas; the inert gas is ionized and impinges upon a target material 2, which in turn the target material 2 is then sputtered to the available surfaces of the physical vapor deposition chamber. Typically, the geometry of the chamber is optimized to focus the sputtered material upon a substrate 4. The substrate 4 is placed upon a pedestal or a heater system 6 and held in place inside the chamber by clip ring 8. The target material 2, as stated earlier, is sputtered upon all the free surfaces inside the physical vapor deposition chamber. This process is often repeated without cleaning the chamber surfaces. This can cause problems in that the films deposited may form a laminate which in turn may delaminate and particulate upon the substrate 4. Contamination of the film deposited on substrate 4 may cause the semiconductor device or other devices using the deposited thin film on the substrate to fail.

A typical solution is shown here, in which a removable shielding system 10 is placed over the free surfaces of the physical vapor deposition chamber. The shielding 10 serves to collect the sputtered target material upon the shielding surface 12 rather than the chamber surface 14. This solution allows accumulated excess sputtered material to be quickly removed from the physical vapor deposition chamber prior to particulating upon a wafer substrate. Historically, without the shielding system in place, the excess sputtered material would be scraped or ground off the chamber walls 12.

Figure 2:
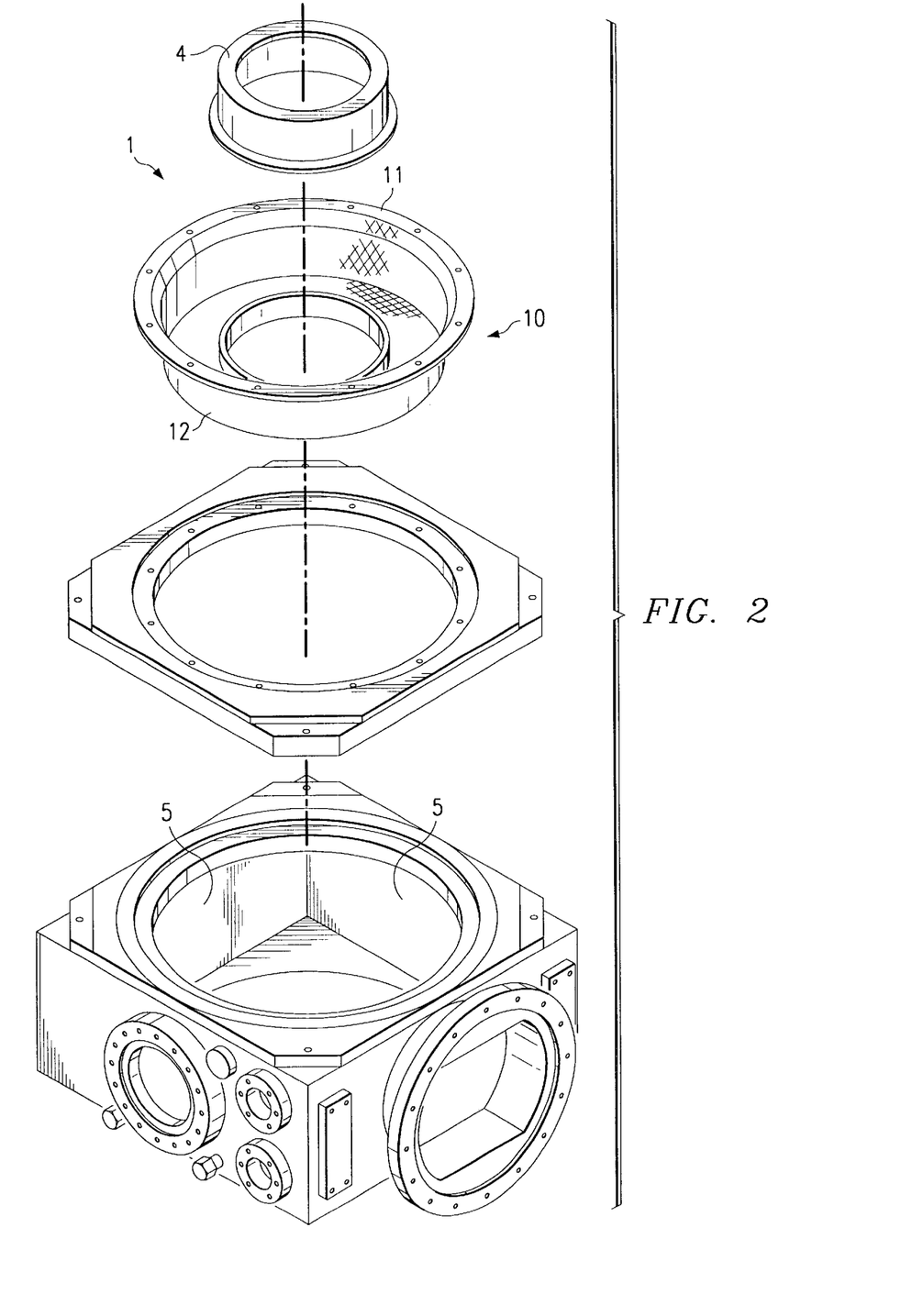
FIG. 2 is an exploded view of one embodiment of a vapor deposition chamber with a sputtering shield and retaining ring according to the present invention.

FIG. 2, illustrates an exploded view of typical physical vapor deposition chamber illustrated in FIG. 1. The chamber walls 14 are a permanent part of the system. Hence, these walls 14 are typically very hard to clean and remove excess sputtered material. Hence, the addition of a removable shielding system 10 allows the excess sputtered material to be removed without grinding or scraping chamber walls 14. The shape of the shielding 10 may be unique to an individual process chamber (i.e. the Applied Material's Endura system, the MRC's Model 603 or the Varian 3000 Series), but the concept of the textured surface can be transferred to any tool set's internal shielding or internal chamber walls.

The surface of a conventional shielding system is relatively flat and may have microscopic deformations of the surface created through the use of a bead blasting process or similar process to create a microscopically rough surface. This microscopically rough surface has been found to aid in the gettering of excess sputtered materials and preventing the delamination of such materials.

Figure 3:
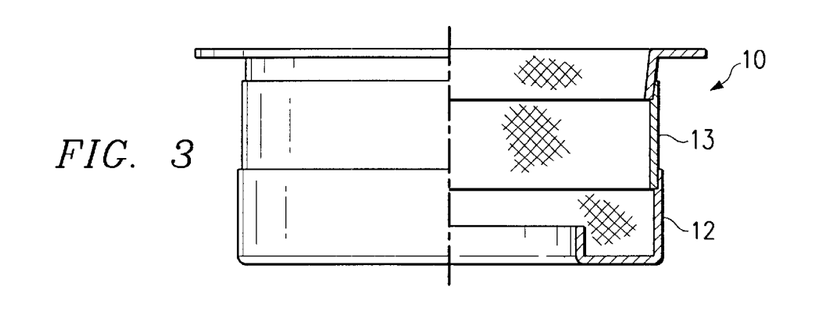
FIG. 3 provides a cross section perspective view of an embodiment of a sputtering shadow shield according to the present invention.

FIG. 3 illustrates a shielding component for a typical vapor deposition chamber. However, in the present invention, the inner surface 11, which collects the excess sputtered target material, has a plurality of projections from the inner surface 11 of the shielding system 10. These projections serve to create a plurality of raised horizontal surfaces 15. The projections serve to relieve and minimize the stress build-up in thin continuous films deposited upon the shielding system 10. The projections fragment the larger continuous film into a series of smaller film surfaces. This reduces membrane stresses and serves to extend the insitu life of a shielding system 10 since membrane stresses of deposited films are not allowed to build up across large continuous free surfaces on the shielding system 10. Hence, the time intensive and difficult task of opening the vacuum chamber can be avoided until the target material has been depleted.

Figure 5:
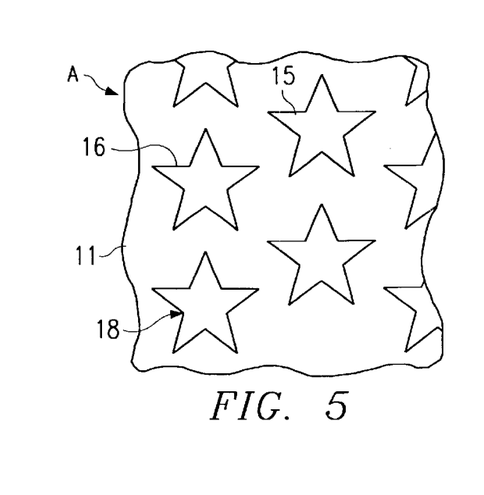
FIG. 5 provides an expanded view of area A in FIG. 4 which shows the shape of the pattern of the features of the textured surface according to the present invention.
Figure 6:
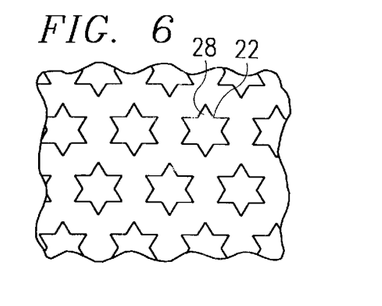
FIG. 6 illustrates a top view of the projections or cavities according to the present invention with a six pointed star outline.

FIG. 5 is a top-down view of the raised horizontal surfaces of the shielding system. This embodiment illustrates that the raised horizontal surfaces may be in the shape of a five-pointed star 16, or a six-pointed star 28 as illustrated in FIG. 6. The reason that the shape of a star has been chosen is that between the arms of a star an angle 18 which is less than 180° has been formed which will allow improved collection sites for securing of the excess sputtered target material. A five-pointed star provides an approximately 128° inner angle 18 between the arms of the star, and a six-pointed star 28 of FIG. 6 provides an approximately 120° inner angle 22 between the arms of the star. The invention, however, should not be limited to a five- or six-pointed star. These shapes have produced unexpected results in that the inner angle has been best defined by the manufacturing method chosen to pattern the shielding. As the number of points in the star increase, the resolution and definition of the angles has been seen to decrease when patterned using photolithographic methods.

Figure 7:
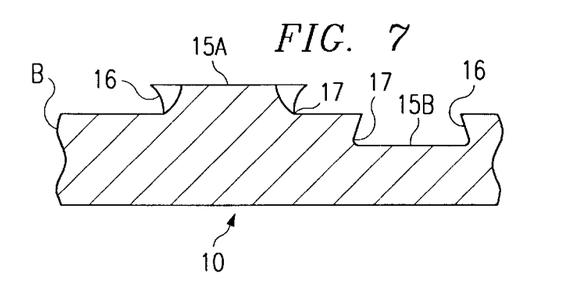
FIG. 7 is a partial cross sectional side view of area B in FIG. 4 illustrating the shape of the boundary side walls according to the present invention.

FIG. 7 is a cross-sectional view of the shielding system 10 which clearly illustrates the raised horizontal surfaces 15A formed upon the inner shielding surface 11. The projections forming the raised horizontal surfaces 24 may be of any height. In this embodiment, a height of 15–18 mils has been chosen. Additionally, the size of the raised horizontal surfaces has been found to be optimized with less than 50 raised horizontal surfaces per inch on the inner surface 11 of the shielding 10. This embodiment illustrates seven to eight raised horizontal surfaces, or stars, per inch. Further, it has been found that a ratio of the raised horizontal surface area to the total surface area helps determine the effectiveness of preventing delamination of deposited thin films. The present invention has been found to work with a ratio of 0.05 to 0.95. The current embodiment, illustrated with five-pointed stars 16, has a ratio of approximately 0.3.

Figure 8:
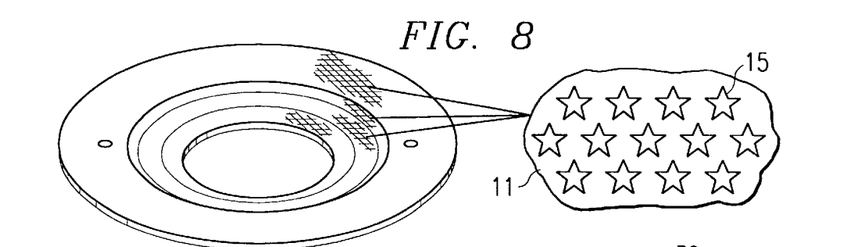
FIG. 8 provides a perspective view of another sputtering shield embodiment.
Figure 9:
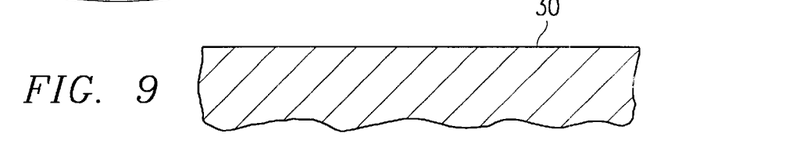

FIG. 8 illustrates a typical cavity shield of a Varian 3000 Series deposition system. Again, the shielding has an inner surface 11 which will be textured with a plurality of raised horizontal surfaces to relieve the build-up of stress across a continuous film, and an outer surface 12 which may be smooth. The shielding typically has a hole or cavity in the center to allow the focus deposition of material primarily on the substrate 2.

Figure 10:
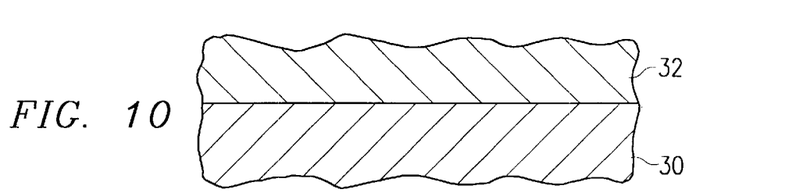
FIG. 10 shows a photoresist applied onto the metal surface of FIG. 9.
Figure 11:
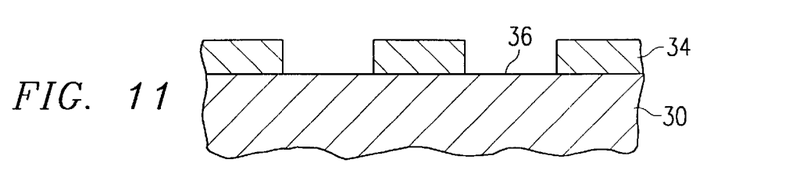
FIG. 11 illustrates the results of placing a mask over the photoresist, and irradiating the photoresist, wherein a portion of the photoresist is removed with a first solvent.
Figure 12:
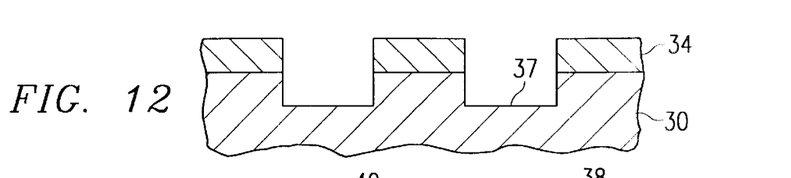
FIG. 12 shows that the exposed metal surface of the sputtering shield is etched away.
Figure 13:
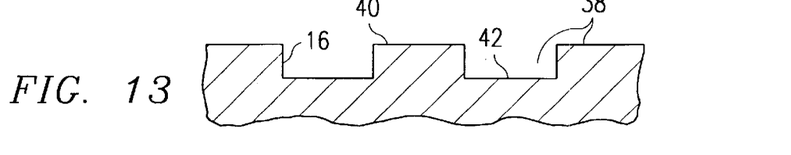
FIG. 13 shows the remaining portion of the photoresist is removed with a second solvent.

FIGS. 9–13 illustrate one potential process for patterning the inner surface 12 of any physical vapor deposition system chamber component in which a metal surface 30 (FIG. 9) will be coated with a photoresistive material 32 (FIG. 10). In turn, this photoresist will be masked, exposed, and developed (FIG. 11) to create the pattern of the raised horizontal surfaces 34 in the photoresist 32. A timed etch process then can be used to either isotropically or anisotropically remove the unmasked materials from the metal surface 30 in FIG. 12. The protected areas 40 under the exposed photoresist 32 are not removed. Hence, the raised horizontal surfaces 40 of FIG. 13 are defined by the cavities 42 of the removed material. It should be noted that this is a timed etch based on the selectivity of the etch to the shielding material, the point being that enough shielding material should be left to both prevent the creation of voids inside the shielding material and to maintain the structural integrity of the shielding material.

Typically an undercut of the raised horizontal surface 40 is formed with an acute angle 17. Again, this acute angle 17 will assist in the securing of excess sputtered material to the shielding surface. However, it should be noted that the steps illustrated in FIGS. 9–13 are only one possible method of creating the textured surface on the shielding. Additionally, both positive and negative resist may be used to form these surfaces 40. Further, the discontinuous or textured surface 38 could be created by actually stamping the textured pattern into the metal or affixing the projections to form the textured surface of the shielding material and that the photolithography means used are but one way of creating the textured surface of the shielding material.

Vapor Deposition Chamber Components

The vapor deposition chamber components of the present invention include, but are not limited to, the sputtering shield 10 and the retaining ring 8. As shown in FIG. 1 and FIG. 2, the shadow shield 10 of the present invention has two sides, an inner side 11 and an outer side 12. The inner side 11 of the sputtering shield 10 has a discontinuous or textured surface to anchor, capture, and/or secure collected sputtered materials. A discontinuous surface, contoured surface, or textured surface herein means a surface with features such as a plurality of projections, cavities, channels or grooves, partitions, or combinations thereof or equivalents.

In a first embodiment of the present invention, the shadow shield 10 has a discontinuous surface which includes features such as a plurality of upwardly directed projections forming raised horizontal surfaces 15 with boundary side walls 16 attached to the inner surface 11. (FIG. 5.) Preferably, the projections 15 are integrally formed onto the inner side 11 of the sputtering shield 10. Alternately, the projections 15 may be attached by welding, formed by stamping, or any other suitable ways of attachment.

The boundary side walls 16 of the projections 15A or the cavities 15B are not perpendicular to the inner side 11 of the sputtering shield 10, but preferably form an acute angle to the inner side 11, thus forming under-cuts 17 in the projections 15 or in the cavities 14. The under-cuts 17 aid in the retention of sputtered material on the inner side 11 of the sputtering shield 10. Preferably, all of the textured surface features of the present invention have under-cuts 17. These characteristics of the discontinuous surface features are illustrated in FIG. 7, which is a partial sectional view of two types of features, a single projection 15A and a single cavity 15B.

The discontinuous surface features include raised horizontal surfaces that may be of any shape. These shapes include but are not limited to a shape such as one with at least three vertices, but it is preferred that the shape be a five pointed star as seen in FIG. 5. Alternately, other shapes may be utilized, as seen in the six pointed star outline 18 of FIG. 7 or alternatively a triangular outline. The vertices provide angular points 18 or edges that aid in the retention of sputtered material to the discontinuous surface of the vapor deposition component. The present invention, however, is not limited to those shapes described herein and any polygon with both obtuse and acute angles along the outer edges may suffice.

The concentration of textured surface features is indicative of the performance of the present invention. The ratio by which this concentration is measured is solidity. Solidity is defined as the amount of non-elevated textured surface area divided by the total textured surface area, e.g., a smooth surface would have a ratio of 1 and an infinitely textured surface would approach a ratio of 0. The present invention works most effectively with a solidity between 0.05 and 0.95.

In a second embodiment of the present invention, the retaining ring 8, which also collects sputtered metals capable of producing microcontaminants, has textured surface features as described earlier in this specification. As on the sputtering shield 10, the textured surface features, such as the plurality of projections 15 (see FIG. 5), are attached to a side of the retaining ring 8 which faces the sputtering source 2 and the sputtered metal is then anchored, captured, and/or secured by the textured surface features.

Figure 4:
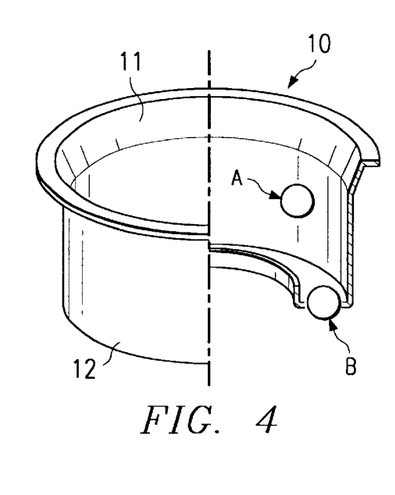
FIG. 4 illustrates isometrically a quarter cut-away perspective view of an embodiment of a sputtering shield according to the present invention.

However, any suitable vapor deposition component configuration or geometry may be utilized for carrying out the purposes of the present invention, which is not limited to those shown in the FIGUREs above. For example, FIGS. 3, 4 and 8 show different sputtering textured or contoured surface shield configurations which embody the present invention.

Furthermore, the projections, cavities, channels or grooves, partitions, or combinations thereof or equivalents can be made to be of any height or depth, which includes but is not limited to fifteen (15) mil. Alternatively, the height or depth may be of thirteen (13), fourteen (14), fifteen (15), sixteen (16), seventeen (17), eighteen (18), nineteen (19), or twenty (20) mil. Additionally, other technologies, such as bead blasting, coating, or other prior art methods or apparatus, can be used in conjunction with the present invention to further reduce or eliminate exfoliation or contamination problems associated with vapor deposition chambers or processes.

Methods of Making the Present Invention

The present invention presents novel methods for making vapor deposition component surfaces which inhibit or prevent the formation of microcontaminants within the vapor deposition chamber.

One method for making vapor deposition component surfaces according to the present invention is to etch selected portions of the surface of the vapor deposition component to form a textured surface. More particularly, the present invention contemplate the selective etching of surfaces of retaining rings 8 and sputtering shields 10. Furthermore, the surfaces of these components are etched so that the textured surface features such as projections, cavities, channels or grooves, partitions, or combinations thereof physically and/or visibly exist on the surface of the vapor deposition component (i.e. the present invention teaches or suggests selective roughening of the surface on a relatively macroscopic level compared with some of the prior art that discloses or teaches the random and micro-roughening of the surface using a method such as bead blasting, etc.).

One method for etching surfaces 30 (i.e. including but not limited to metal surfaces) uses photolithography to form patterns on the surfaces 30. These patterns are formed by taking a clean vapor deposition chamber component, such as sputtering shield 10 or retaining ring 8, having the surface 30 to be treated (FIG. 9) and applying a photoresist 32 to the surface 30 (FIG. 10). A photoresist is a material which changes structure when irradiated (exposed) such that different solvents are needed to dissolve exposed portions than non-exposed portions. A mask is then placed over the photoresist 32 and non-masked portions 34 are exposed. The exposed portions 34 of the photoresist 32 are then removed with a first solvent thereby exposing selected portions 36 of the surface 30 (FIG. 11) which is then etched (FIG. 12). This etching, may be done by suitable means such as plasma etching, but in the present invention, it is preferred that the etching be done with an acid capable of dissolving the surface 30 metal. Finally, the remaining non-exposed portions 34 of the photoresist 32 are dissolved with a second solvent and a clean discontinuous surface 38 is left as shown in FIG. 13. Additional cleaning according to normal industry practice, such as ultrasonic cleaning, may be performed to place the vapor deposition chamber components into condition for use.

Etching the metal surface 30 of the vapor deposition chamber components creates the textured surface 38 with features having a boundary side wall 16 with an under-cut area 17. The boundary side walls of the features are formed at an acute angle to the surface 30.

Another photolithographic method for etching surfaces 30 takes a clean vapor deposition chamber component, such as sputtering shield 10 or retaining ring 8, having a surface 30 to be treated (FIG. 9) and applying a photoresist 32 to the surface 30 (FIG. 10). A mask is then placed over the photoresist 32 and non-masked portions 34 are irradiated. The non-irradiated portions of the photoresist are then removed with the second solvent and the exposed metal of the sputtering shield 10 is then etched (FIG. 12). Finally, the remaining irradiated portions of the photoresist are removed with the first solvent (FIG. 13). Additional cleaning according to normal industry practice, such as ultrasonic cleaning, may be performed to place the vapor deposition chamber components into condition for use.

The result of these photolithographic processes is a vapor deposition chamber component with a textured surface which inhibits the formation of microcontaminants in a vapor deposition chamber system 5. It is within the scope of the present invention to utilize any suitable or equivalent etching method for making the textured surfaces of the present invention and is not limited to those disclosed or shown in the FIGUREs.

While etching methods for creating textured surfaces of the present invention are described above, textured surfaces may also be produced by other methods. One such method is to take a metal piece such as a pre-stamped metal plate, and hot pressing or rolling a die onto the surface of the plate thereby forming a texture on the surface. The textured plate is then formed into a suitable configuration for a vapor deposition chamber component. The vapor deposition chamber component can be made by forming several pieces which are attached together. See FIG. 2. However, any other suitable method for creating textured surfaces within the process chamber is considered within the scope of the present invention, and the present invention is not limited to the methods disclosed or shown in the FIGUREs.

The preferred embodiment of the invention is described above in the FIGUREs and Detailed Description. Unless specifically noted, it is the intention of the inventors that the words and phrases in the specification and claims be given the ordinary and accustomed meanings to those of ordinary skill in the applicable art(s). The foregoing description of preferred embodiments and best mode of the invention known to applicant at the time of filing the application has been presented for the purposes of illustration and description. It is not intended to be exhaustive or to limit the invention to the precise form disclosed, and many modifications and variations are possible in the light of the above teaching. The embodiments were chosen and described in order to best explain the principles of the invention and its practical application, and to enable others skilled in the art to best utilize the invention in various embodiments and with various modifications as are suited to the particular use contemplated.

Likewise, any use of the words "function" or "means" in the Detailed Description is not intended to indicate a desire to invoke the special provisions of 35 U.S.C. Sec. 112, Paragraph 6 to define his invention. To the contrary, if the provisions of 35 U.S.C. Sec. 112, Paragraph 6 are sought to be invoked to define the invention, the claims will specifically state the phrases "means for" or "step for" and a function, without reciting in such phrases any structure, material, or act in support of the function. Even when the claims recite a "means for" or "step for" performing a function, if they also recite any structure, material, or acts in support of that means or step, then the invention is not to invoke the provisions of 35 U.S.C. Sec. 112, Paragraph 6. Moreover, even if the inventors invoke the provisions of 35 U.S.C. Sec. 112, Paragraph 6 to define the invention, it is the intention that the invention not be limited only to the specific structure, material, or acts that are described in his preferred embodiment. Rather, if the claims specifically invoke the provisions of 35 U.S.C. Sec. 112, Paragraph 6, it is nonetheless the intention to cover and include any and all structures, materials, or acts that perform the claimed function, along with any and all known or later developed equivalent structures, materials, or acts for performing the claimed function.

The inventions described herein are not to be limited to the specific algorithms, methods, or steps disclosed in the preferred embodiment, but rather, are intended to be used with any and all such methods, algorithms, or steps. In its preferred form, applicant divides the method for etching surfaces into several steps. However, with appropriate knowledge and application of that knowledge to those of ordinary skill in the art, some of the steps can be implemented into a single step. Likewise, applicant divides the method of hot pressing or rolling texture onto surfaces into several steps However, with appropriate knowledge and application of that knowledge to those of ordinary skill in the art, some of the steps can be implemented into a single step. Thus, it is not the intention to limit the invention to any particular form or any number of method steps or to any specific procedural arrangement.

In summary, the present invention provides a method that prevents or delays the delamination of thin films deposited on vapor deposition chamber components.

The present invention provides a method of reducing or delaying the exfoliation of thin films within a vapor deposition chamber that substantially eliminates or reduces disadvantages and problems associated with previously developed shielding systems and methods used for their production.

More specifically, the present invention provides a method for reducing the exfoliation of deposited films within a vapor deposition system. The method of preventing the delamination of thin films deposited of a vapor deposition chamber components includes the steps of depositing a series of thin films on a discontinuous surface. The internal stress of the deposited thin films are relaxed by fragmenting the deposited thin film with the discontinuous surface.

Although the present invention has been described in detail, it should be understood that various changes, substitutions and alterations can be made hereto without departing from the spirit and scope of the invention as described by the appended claims.

What is claimed is:

1. A method of reducing the exfoliation of thin film laminate within a processing chamber comprising the steps of:

depositing a thin film on a discontinuous surface; and relaxing a stress within a thin film deposited on the discontinuous surface by fragmenting the deposited thin film with the discontinuous surface, wherein the discontinuous surface comprises a plurality of projections of any height wherein the plurality of projections form a plurality of raised horizontal surfaces wherein the raised horizontal surfaces are in any shape having at least three vertices wherein a ratio of the area of the raised horizontal surface to the total area of a horizontal surface is between 0.05 to 0.95, and wherein the raised horizontal surfaces have undercut vertical sidewalls.

2. The method of claim 1, wherein the raised horizontal surfaces are in a shape of stars having angles formed by an intersection between a pair of arms of the stars between 120° and 128°.

3. The method of claim 1, wherein the raised horizontal surfaces are in a shape of 5 pointed stars.

4. A component surface for use in a deposition chamber comprising:

a first portion of the surface; and a second portion of the surface;

wherein the second portion of the surface comprises a plurality of raised horizontal surfaces from the first portion of the surface, wherein the raised horizontal surfaces have undercut sidewalls, wherein a ratio of the raised horizontal surface area to the total horizontal surface area is between 0.05 to 0.95, and wherein the plurality of raised horizontal surfaces are in a shape of stars having angles formed by an intersection between a pair of arms of the stars between 120° and 128°.

5. A method of texturing a surface to be used in a deposition chamber comprising:

providing a surface;

depositing a patterned mask on the surface;

etching the surface; and wherein the etching removes material from the surface and forms a plurality of raised horizontal surfaces, wherein the raised horizontal surfaces have undercut sidewalls, wherein a ratio of the raised horizontal surface area to the total horizontal surface area is between 0.05 to 0.95, and wherein the raised horizontal surfaces are in a shape of stars having angles formed by an intersection between a pair of arms of the stars between 120° and 128°.

* * * * *